(12) United States Patent
Turney et al.

(10) Patent No.: US 11,988,418 B2
(45) Date of Patent: May 21, 2024

(54) VAPOR COMPRESSION CYCLE WITH DIRECT PUMPED TWO-PHASE COOLING

(71) Applicant: Hamilton Sundstrand Corporation, Charlotte, NC (US)

(72) Inventors: Joseph E. Turney, Amston, CT (US); Raphael Mandel, West Hartford, CT (US); Ram Ranjan, West Hartford, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/944,534

(22) Filed: Sep. 14, 2022

(65) Prior Publication Data

US 2024/0085068 A1    Mar. 14, 2024

(51) Int. Cl.
*F25B 25/00*    (2006.01)
*B64D 13/06*    (2006.01)
*F25B 39/00*    (2006.01)
*H05K 7/20*    (2006.01)

(52) U.S. Cl.
CPC ............ *F25B 25/005* (2013.01); *F25B 39/00* (2013.01); *H05K 7/20936* (2013.01); *B64D 2013/0614* (2013.01); *B64D 2013/0618* (2013.01); *F25B 2400/23* (2013.01)

(58) Field of Classification Search
CPC .... F25B 25/005; F25B 39/00; F25B 2400/23; H05K 7/20936; B64D 2013/0614; B64D 2013/0618
See application file for complete search history.

(56) References Cited

U.S. PATENT DOCUMENTS

| 8,327,651 | B2 | 12/2012 | Finney et al. |
| 8,966,934 | B2 | 3/2015 | Christensen |
| 10,017,032 | B2 | 7/2018 | Behrens et al. |
| 10,746,440 | B2 | 8/2020 | Donovan et al. |
| 11,162,388 | B1 | 11/2021 | Snyder et al. |

(Continued)

FOREIGN PATENT DOCUMENTS

JP    2000313226 A    11/2000

OTHER PUBLICATIONS

European Search Report for European Application No. 23196915.5; Date of Search: Jan. 8, 2024; 8 pages.

*Primary Examiner* — Henry T Crenshaw
*Assistant Examiner* — Kamran Tavakoldavani
(74) *Attorney, Agent, or Firm* — CANTOR COLBURN LLP

(57) ABSTRACT

Cooling systems include a cold sink thermally coupled to a heat load, a separator configured to separate liquid and vapor portions of a working fluid, and a cooling cycle having a vapor loop and a liquid loop, the cooling cycle having the working fluid configured to pass through both the vapor loop and the liquid loop. The vapor loop includes the separator, a compressor, a condenser, and a valve. A vapor form of the working fluid flows from the separator into the compressor, and the working fluid then flows to the condenser, and then through the valve, and returned to the separator. The liquid loop includes the cold sink, the separator, and a pump. A liquid form of the working fluid flows from the separator into the pump and the working fluid is increased in pressure and supplied to the cold sink and then returned to the separator.

20 Claims, 7 Drawing Sheets

(56) References Cited

U.S. PATENT DOCUMENTS

| | | |
|---|---|---|
| 11,231,209 B2 | 1/2022 | Cavalleri et al. |
| 11,561,033 B1* | 1/2023 | Vaisman .................... F25B 7/00 |
| 2019/0230822 A1* | 7/2019 | Neuman ............. H05K 5/0017 |
| 2019/0310000 A1* | 10/2019 | Shan ....................... F25B 49/02 |
| 2019/0360730 A1 | 11/2019 | Hagh et al. |
| 2021/0171204 A1* | 6/2021 | Retersdorf ............. B64D 13/06 |
| 2022/0128283 A1* | 4/2022 | Hinderliter ............... F25B 5/02 |
| 2022/0151102 A1* | 5/2022 | Snyder ..................... F25B 5/02 |
| 2022/0178602 A1 | 6/2022 | Zug |

* cited by examiner

1

VAPOR COMPRESSION CYCLE WITH DIRECT PUMPED TWO-PHASE COOLING

BACKGROUND

The subject matter disclosed herein generally relates to cooling systems and, more particularly, to vapor compression cycles with direct pumped two-phase cooling.

Some conventional cooling systems on aircraft utilize air cycle cooling. Hot, pressurized air from the engine is cooled and compressed and used to cool avionics systems and environmental systems, such as the cabin and flight deck. Advancements in composite materials have introduced light yet strong composite components to replace heavier metal components on aircraft. For example, aircraft wings can contain multiple composite components to form a largely composite wing. Composite components do have certain drawbacks, however. Some composite components cannot withstand the high temperatures of the pressurized air bled from the engine that is used for cooling. Thus, using conventional air cycle cooling alone can be unsuitable in some aircraft constructed with composite components. In these cases, alternate cooling systems must be used.

Thermal management of temperature-sensitive components under harsh environments may require a coolant at temperatures below ambient temperature. Typically, this is accomplished using a vapor compression cycle to chill a secondary (indirect) coolant to a required sub-ambient temperature, at the expense of system efficiency, size, and weight due to the required additional components and inefficiencies. Conventional vapor cycle cooling utilizes hydrofluorocarbon refrigerants, such as R-134a. Refrigerant vapor cycle systems offer good performance relative to system weight. Minimizing the weight of aircraft systems increases efficiency of the aircraft and reduces fuel consumption. However, due to environmental concerns and potential regulations, reducing or eliminating the use of R-134a and similar refrigerants is desirable. Other refrigerants, such as carbon dioxide, have lower global warming potential. However, conventional carbon dioxide cooling systems are too heavy to be used in aircraft without incurring a substantial negative effect to efficiency and fuel consumption. Accordingly, it may be desirable to have systems that are more efficient, provide lower weight, and may provide less risk to the environment.

SUMMARY

According to some embodiments, cooling systems are provided. The cooling systems include a cold sink thermally coupled to a heat load, a separator configured to separate liquid and vapor portions of a working fluid, and a cooling cycle having a vapor loop and a liquid loop, the cooling cycle having the working fluid configured to pass through both the vapor loop and the liquid loop. The vapor loop comprises the separator, a compressor, a condenser, and a valve. A vapor form of the working fluid flows from the separator into the compressor, and the working fluid then flows to the condenser, and then through the valve, and returned to the separator. The liquid loop comprises the cold sink, the separator, and a pump. A liquid form of the working fluid flows from the separator into the pump and the working fluid is increased in pressure and supplied to the cold sink and then returned to the separator.

In addition to one or more of the features described herein, or as an alternative, further embodiments of the cooling systems may include that the working fluid is 1,1,1,2-Tetrafluoroethane (R-134a) or 2,3,3,3-Tetrafluoropropene (R-1234yf).

In addition to one or more of the features described herein, or as an alternative, further embodiments of the cooling systems may include that the heat load is a power electronics component of an aircraft.

In addition to one or more of the features described herein, or as an alternative, further embodiments of the cooling systems may include that the vapor portion and the liquid portion of the working fluid are separated by gravity in the separator.

In addition to one or more of the features described herein, or as an alternative, further embodiments of the cooling systems may include that the condenser is fluidically coupled to a ram air duct of an aircraft.

In addition to one or more of the features described herein, or as an alternative, further embodiments of the cooling systems may include that the separator is arranged downstream from the cold sink as a downstream separator. The cooling system further includes an upstream separator arranged upstream from the cold sink and configured to separate liquid and vapor portions of the working fluid, wherein a liquid portion of the working fluid is sourced from the upstream separator and directed into the cold sink.

In addition to one or more of the features described herein, or as an alternative, further embodiments of the cooling systems may include a bypass to direct the vapor portion of the working fluid from the upstream separator to the downstream separator and bypassing the cold sink.

In addition to one or more of the features described herein, or as an alternative, further embodiments of the cooling systems may include a valve arranged along the bypass.

In addition to one or more of the features described herein, or as an alternative, further embodiments of the cooling systems may include a heat exchanger configured to receive a portion of the working fluid from the vapor loop output from the condenser as a first fluid and a mixture of fluid from the vapor loop and the liquid loop as a second fluid, wherein the second fluid is cooled to a liquid state as it exits the heat exchanger and enters the cold sink.

In addition to one or more of the features described herein, or as an alternative, further embodiments of the cooling systems may include a second valve arranged between the condenser and the heat exchanger to change the first fluid from a liquid to a two-phase fluid prior to entering the heat exchanger.

In addition to one or more of the features described herein, or as an alternative, further embodiments of the cooling systems may include that the first fluid is changed to a vapor state as it exits the heat exchanger, and wherein the first fluid in vapor form is directed to the separator.

In addition to one or more of the features described herein, or as an alternative, further embodiments of the cooling systems may include an additional valve arranged between the cold sink and the separator.

In addition to one or more of the features described herein, or as an alternative, further embodiments of the cooling systems may include a thermal energy storage device arranged along the liquid loop between the cold sink and the separator.

In addition to one or more of the features described herein, or as an alternative, further embodiments of the cooling systems may include an additional valve arranged between the thermal energy storage device and the separator.

In accordance with some embodiments, aircraft cooling systems are provided. The aircraft cooling systems include a heat load and a cooling system. The cooling system includes a cold sink thermally coupled to the heat load, a separator configured to separate liquid and vapor portions of a working fluid, and a cooling cycle having a vapor loop and a liquid loop, the cooling cycle having the working fluid configured to pass through both the vapor loop and the liquid loop. The vapor loop comprises the separator, a compressor, a condenser, and a valve. A vapor form of the working fluid flows from the separator into the compressor, and the working fluid then flows to the condenser, and then through the valve, and returned to the separator. The liquid loop comprises the cold sink, the separator, and a pump. A liquid form of the working fluid flows from the separator into the pump and the working fluid is increased in pressure and supplied to the cold sink and then returned to the separator.

In addition to one or more of the features described herein, or as an alternative, further embodiments of the aircraft cooling systems may include that the heat load comprises at least one power electronics component of an aircraft.

In addition to one or more of the features described herein, or as an alternative, further embodiments of the aircraft cooling systems may include a thermal energy storage device arranged along the liquid loop between the cold sink and the separator.

In addition to one or more of the features described herein, or as an alternative, further embodiments of the aircraft cooling systems may include that the separator is arranged downstream from the cold sink as a downstream separator. The cooling system further includes an upstream separator arranged upstream from the cold sink and configured to separate liquid and vapor portions of the working fluid, wherein a liquid portion of the working fluid is sourced from the upstream separator and directed into the cold sink.

In addition to one or more of the features described herein, or as an alternative, further embodiments of the aircraft cooling systems may include a heat exchanger configured to receive a portion of the working fluid from the vapor loop output from the condenser as a first fluid and a mixture of fluid from the vapor loop and the liquid loop as a second fluid, wherein the second fluid is cooled to a liquid state as it exits the heat exchanger and enters the cold sink.

In addition to one or more of the features described herein, or as an alternative, further embodiments of the aircraft cooling systems may include that the condenser is fluidically coupled to a ram air duct of an aircraft.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The subject matter is particularly pointed out and distinctly claimed at the conclusion of the specification. The foregoing and other features, and advantages of the present disclosure are apparent from the following detailed description taken in conjunction with the accompanying drawings in which:

DETAILED DESCRIPTION

Figure 1:
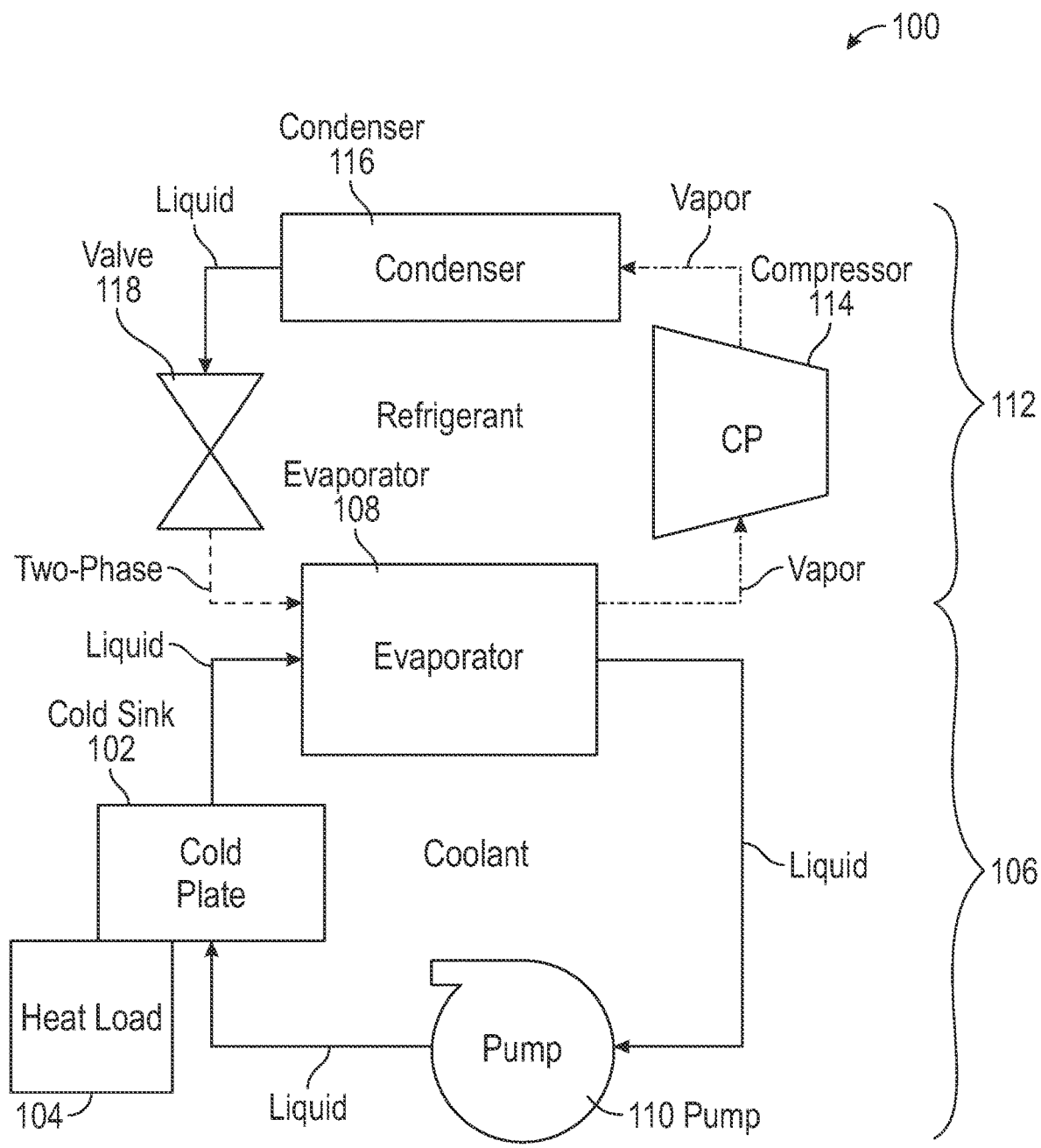
FIG. 1 is a schematic illustration of a conventional two-fluid cooling system.

As shown and described herein, various features of the disclosure will be presented. Various embodiments may have the same or similar features and thus the same or similar features may be labeled with similar reference numerals. Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Referring to FIG. 1, a schematic illustration of a conventional two-fluid cooling cycle 100 is shown. The two-fluid cooling cycle 100 is configured to provide a cold sink 102 that is thermally coupled with one or more components and/or fluids associated with one or more components (illustrated as heat load 104), to provide cooling thereto. For example, in some embodiments or configurations, the cold sink 102 may be a cold plate having internal fluid passages for receiving a fluid of the two-fluid cooling cycle 100 which absorbs heat from the heat load 104. In some configurations, the two-fluid cooling cycle 100 may be described as a vapor cycle loop that is thermally connected to a liquid loop. The heat load 104 may be power electronics, a working fluid line of a cooling loop/cycle, or the like, and/or portions thereof as will be appreciated by those of skill in the art. The heat load 104, and heat loads described and employed herein, may be, for example and without limitation, electronic devices such as computer processes, motor controllers, radio/radar systems, power amplifiers, diodes, inductors, motors, and/or other electric and/or electronic devices.

To operate as a source of heat removal from the heat load 104, the cold sink 102 is part of a coolant loop 106. The coolant loop 106 is a closed-loop system that includes the cold sink 102, an evaporator 108, and a pump 110. The coolant loop 106 includes a coolant fluid within a closed-loop flow path that passes from the cold sink 102, into and through the evaporator 108, is pumped up in pressure at the pump 110, and returned to the cold sink 102. As the coolant passes through the cold sink 102, it will pick up heat from the heat load 104 and increase in temperature. The heated coolant will then enter the evaporator 108 where excess heat will be extracted and the coolant will be cooled. The cooled coolant will then be increased in pressure at the pump 110 to ensure that the coolant is in a liquid phase prior to entering the cold sink 102. It will be appreciated that in some configurations, the coolant of the coolant loop 106 remains in a liquid phase throughout the coolant loop 106, thereby preventing or avoiding inefficiencies due to phase changes and/or flow disruptions.

The heat picked up by the coolant of the coolant loop 106 within the cold sink 102 is removed at the evaporator 108. The evaporator 108 is part of the coolant loop 106 and part of a refrigerant loop 112. The evaporator 108 receives, as a first working fluid, the coolant of the coolant loop 106 and, as a second working fluid, a refrigerant of the refrigerant loop 112. The refrigerant will pick up heat from the coolant of the coolant loop 106 within the evaporator 108 and enter a vapor phase. The heated refrigerant (vapor) will then be compressed within a compressor 114, condensed (from vapor to liquid) within a condenser 116 (e.g., a heat exchanger to remove heat), and then expanded within or through a valve 118 before returning to the evaporator 108 as a two-phase fluid, where it will pick up heat and evaporate into the vapor phase through interaction with the heated coolant of the coolant loop 106 within the evaporator 108. The valve 118 may be an expansion valve, controllable valve, or the like, as will be appreciated by those of skill in the art.

Thermal management of temperature-sensitive components under harsh environments often require a coolant at temperatures below ambient. The two-fluid cooling cycle 100 shown in FIG. 1 provides such cooling. A vapor compression cycle (e.g., refrigerant loop 112) is used to chill a secondary (indirect) coolant (e.g., coolant loop 106) to required sub-ambient temperatures (FIG. 1), at the expense of system efficiency, size, and weight due to the required components and inefficiencies. For example, excess vapor cycle temperatures lift may be required to drive heat transfer in an evaporator. Further, relatively large flow rates may be required in a liquid portion of the loop(s) to maintain consistent cooling for high heat loads. Furthermore, additional temperature lift may be required to drive heat transfer in the condenser, particularly if the coolant temperature is below ambient. These and other inefficiencies may be addressed, at least in part, through implementations of embodiments of the present disclosure.

In the two-fluid cooling cycle 100 of FIG. 1, two separate working fluids are used. A coolant is used in the coolant loop 106 and a separate refrigerant is used in the refrigerant loop 112. In some configurations, the coolant of the coolant loop 106 may be, for example and without limitation, water, propylene-glycol water mixture, ethylene-glycol water mixture, etc., and the refrigerant of the refrigerant loop 112 may be, for example and without limitation, 1,1,1,2-Tetrafluoroethane (R-134a), a mixture of difluoromethane and pentafluoroethane (R-410A), 2,3,3,3-Tetrafluoropropene (R-1234yf), or 1,1,1,3,3,3-Hexafluoropropane (236fa), etc. Using two separate fluids can result in inefficiencies, such as requiring two separate fluid systems, ensuring proper thermal exchange occurs at the correct locations of the respective loops, and the like.

In view of the above and to provide other advantages, embodiments of the present disclosure are directed to single fluid cooling systems. In accordance with embodiments of the present disclosure, a refrigerant system/loop is used to directly cool the sensitive components (e.g., heat load 104) via an evaporator cold plate (e.g., cold sink 102), thereby eliminating the additional components associated with the indirect loop and their inefficiencies (i.e., components of the refrigerant loop 112). This is achieved through two-phase cooling, where a working fluid is converted between different phase states to accommodate thermal pick up and operate as a heat sink to the respective component(s) and/or system(s). In single-fluid, two-phase cooling systems, using a two-phase mixture coming directly from an expansion valve (e.g., valve 118) of the vapor compression cycle (e.g., refrigerant loop 112) can be problematic, as two-phase flow can present flow maldistribution issues that result in system failure under high heat loads.

Figure 2:
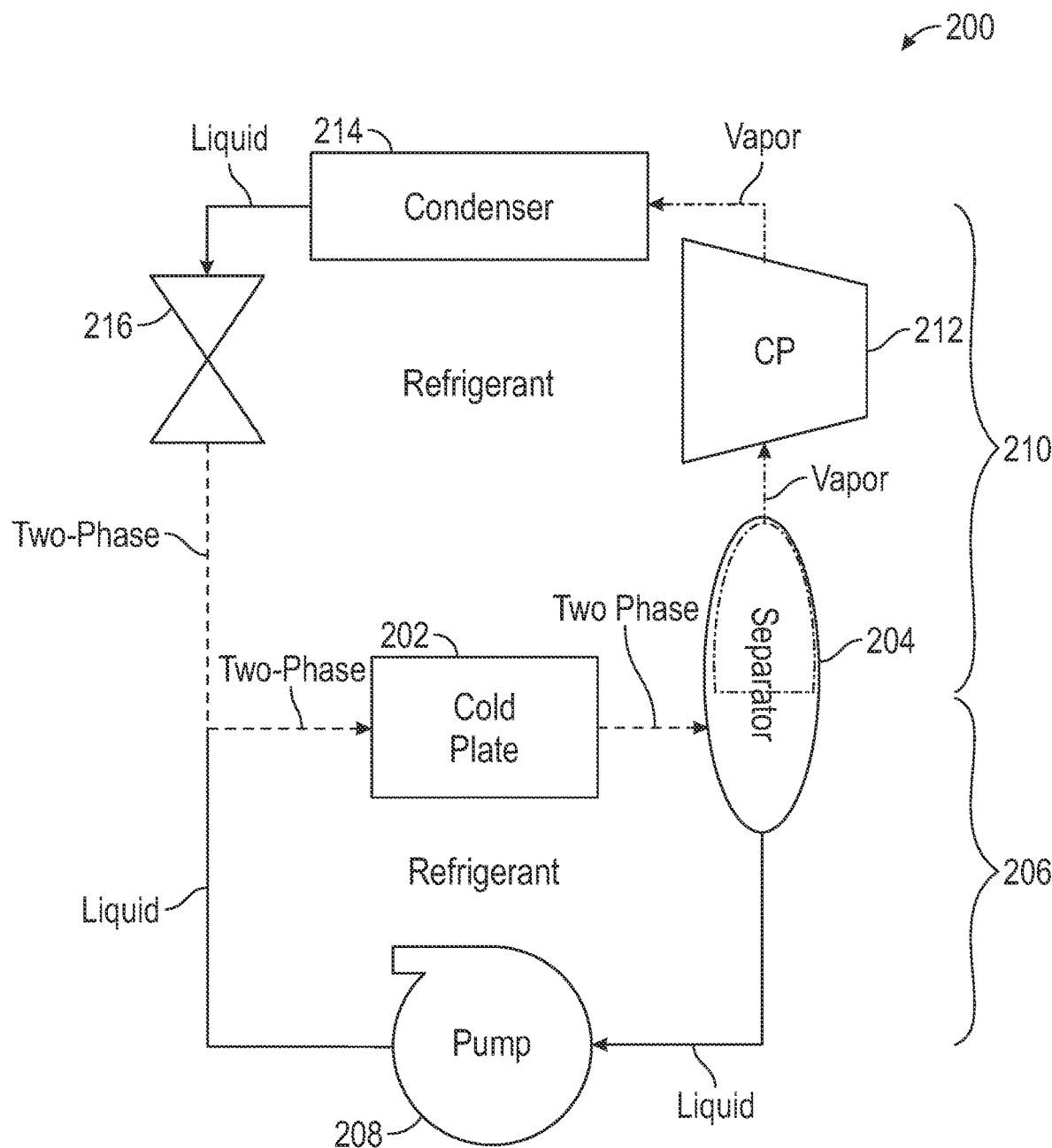
FIG. 2 is a schematic illustration of a single fluid cooling system in accordance with an embodiment of the present disclosure.

For example, referring to FIG. 2, a single-fluid, two-phase cooling system 200 is schematically shown. The system 200 includes a cold sink (e.g., cold plate 202) that may be thermally coupled to a heat load (e.g., component or system, not shown) to provide cooling thereto. In this configuration, because a single fluid (e.g., a refrigerant) is used in the cycle of the system 200, a two-phase fluid exits the cold plate 202 where heat was picked up from the coupled heat load. The refrigerant within the system 200 may be, for example and without limitation, 1,1,1,2-Tetrafluoroethane (R-134a) or 2,3,3,3-Tetrafluoropropene (R-1234yf), although other refrigerants may be used without departing from the scope of the present disclosure. The two-phase fluid will be separated into liquid and vapor components within a separator 204. In a liquid loop 206 of the system 200, the liquid portion of the refrigerant sourced from the separator 204 is increased in pressure through a pump 208, similar to the configuration in FIG. 1. The increased pressure liquid is then mixed with a two-phase portion received from a vapor loop 210 of the system 200 and supplied back into the cold plate 202.

In the vapor loop 210, the vapor of the refrigerant is passed from the separator 204 into a compressor 212 that increases the pressure of the vapor which is then passed into a condenser 214 which converts the vapor-phase refrigerant into a liquid-phase refrigerant. The liquid refrigerant, after exiting the condenser 214, will be expanded within an expansion valve 216 or other type of valve. The two-phase refrigerant will then mix with the liquid phase refrigerant upstream from the cold plate 202. As the two-phase refrigerant passes through the cold plate 202, the refrigerant will pick up heat from the connected heat load and remain in a two-phase state as it enters the separator 204 and repeats the cycle.

One of the drawbacks of the system 200 of FIG. 2 is that the refrigerant enters the cold plate 202 as a two-phase fluid. The two-phase nature of the refrigerant can result in maldistribution of flow through the cold plate 202 and thus the cooling efficiency thereof may be reduced.

One possibility is to insert a heat exchanger before the cold sink and use some of the liquid generated from the condenser to condense the refrigerant entering the cold sink. For example, referring now to FIG. 3, a single-fluid, two-phase cooling system 300 is schematically shown. The system 300 includes a cold sink (e.g., cold plate 302) that may be thermally coupled to a heat load or system (not shown) to provide cooling thereto. In this configuration, because a single fluid (e.g., a refrigerant) is used in the cycle of the system 300, a two-phase fluid exits the cold plate 302 where heat was picked up from the coupled heat load.

In this configuration, a valve 304 is arranged between the cold plate 302 and a separator 306. The valve 304 is configured to ensure that the pressure at the cold plate 302 is greater than the pressure at other locations along the flow paths (e.g., at a second valve 322 to create a temperature difference in a heat exchanger 314, described below). The separator 306 receives a two-phase fluid from the cold plate 302 and valve 304. The liquid portion of the fluid is separated in the separator 306 and directed in a liquid loop 308. The liquid is pumped in pressure at a pump 310 and then mixed with two-phase fluid from a vapor loop 312 and passed into a heat exchanger 314. The heat exchanger 314 is configured to convert the two-phase fluid into liquid state prior to entering the cold plate 302. This conversion to liquid state upstream of the cold plate 302 increases the cooling efficiency of the cold plate 302 and can eliminate flow disruptions that can arise in a two-phase fluid as it passes through the cold plate 302.

In the vapor loop 312 of the system 300, the vapor is separated at the separator 306 and directed into a compressor 316 to increase a pressure thereof. The vapor will then flow into a condenser 318 where it changes into a liquid state. A portion of the liquid is passed through a first throttle valve 320 where it expands from the liquid state into a two-phase state and is mixed with the liquid from the pump 310 of the liquid loop 308. Another portion of the liquid is passed into and through a second throttle valve 322 where it is converted into a two-phase fluid. The liquid is expanded and the pressure is reduced below the pressure at the first throttle valve 320 such that the fluid is colder and can provide cooling to the two-phase mixture coming from the first throttle valve 320. The second fluid of two-phase fluid (from the second throttle valve 322) is passed through the heat exchanger 314 to cool a flow of other two-phase fluid from the pump 310 and the first throttle valve 320. The result is that the mixture of fluid from the pump 310 and the first throttle valve 320 is cooled to generate a liquid prior to entering the cold plate 302. The flow of the two-phase fluid from the second throttle valve 322 and through the heat exchanger 314 will heat up and vaporize. This vapor may be directed directly to the separator 306 and bypass the cold plate 302.

Figure 3:
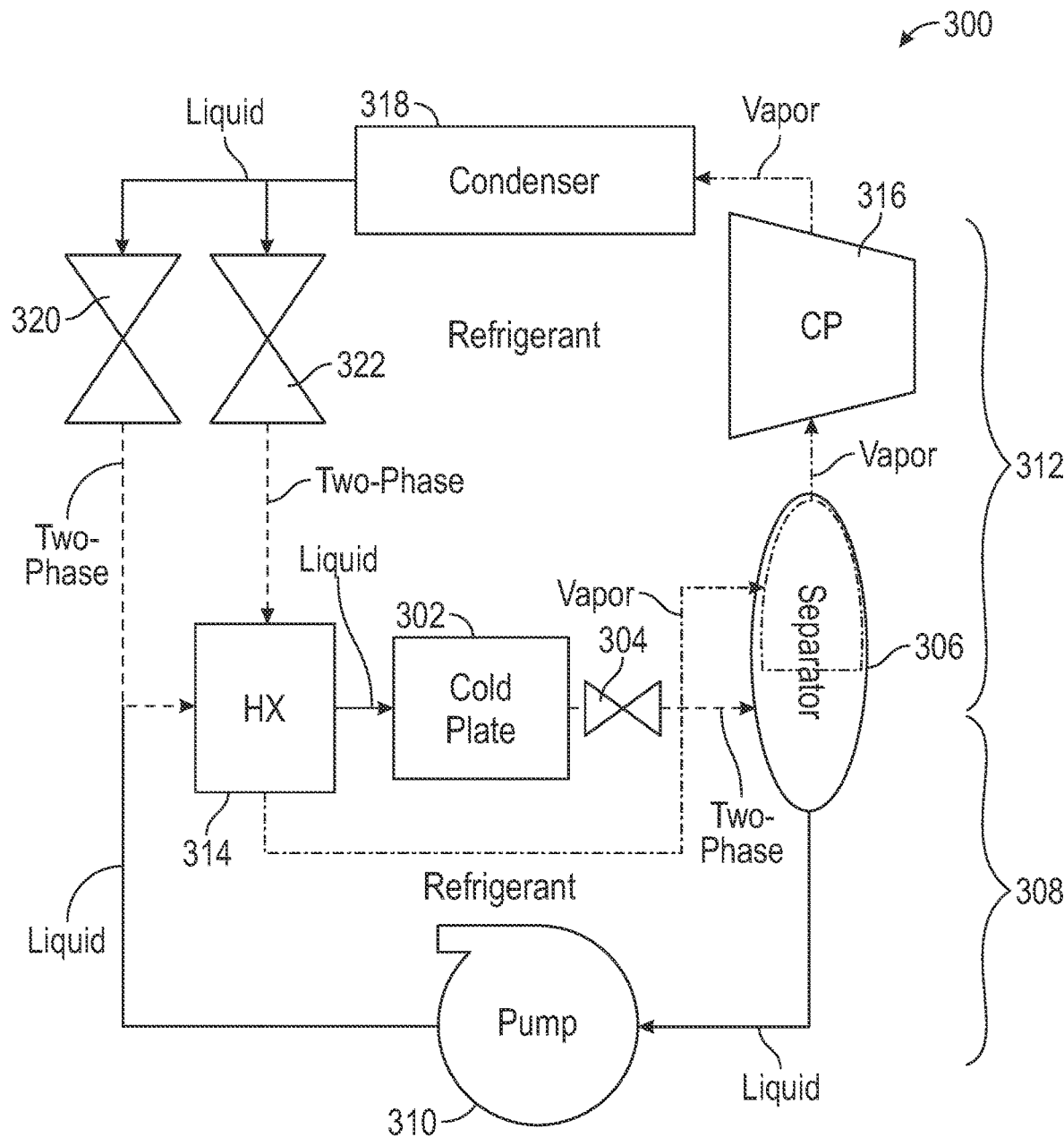
FIG. 3 is a schematic illustration of a single fluid cooling system in accordance with an embodiment of the present disclosure.

Although the system 300 of FIG. 3 solves the issue of a two-phase fluid for the cold plate, such a configuration comes at the expense of efficiency and weight. For example, the system 300 includes the added valves 304, 322, and the heat exchanger 314, as compared to the system of FIG. 2. In operation of the system 300, the second throttle valve 322 will expand the refrigerant to a lower pressure than the first throttle valve 320 (i.e., flow exiting the second throttle valve 322 is colder). The valve 304 will further expand the flow down to the pressure coming from the second throttle valve 322. The valve 304 can also be used to control the relative flow rates between the two throttle valves 320, 322.

Figure 4:
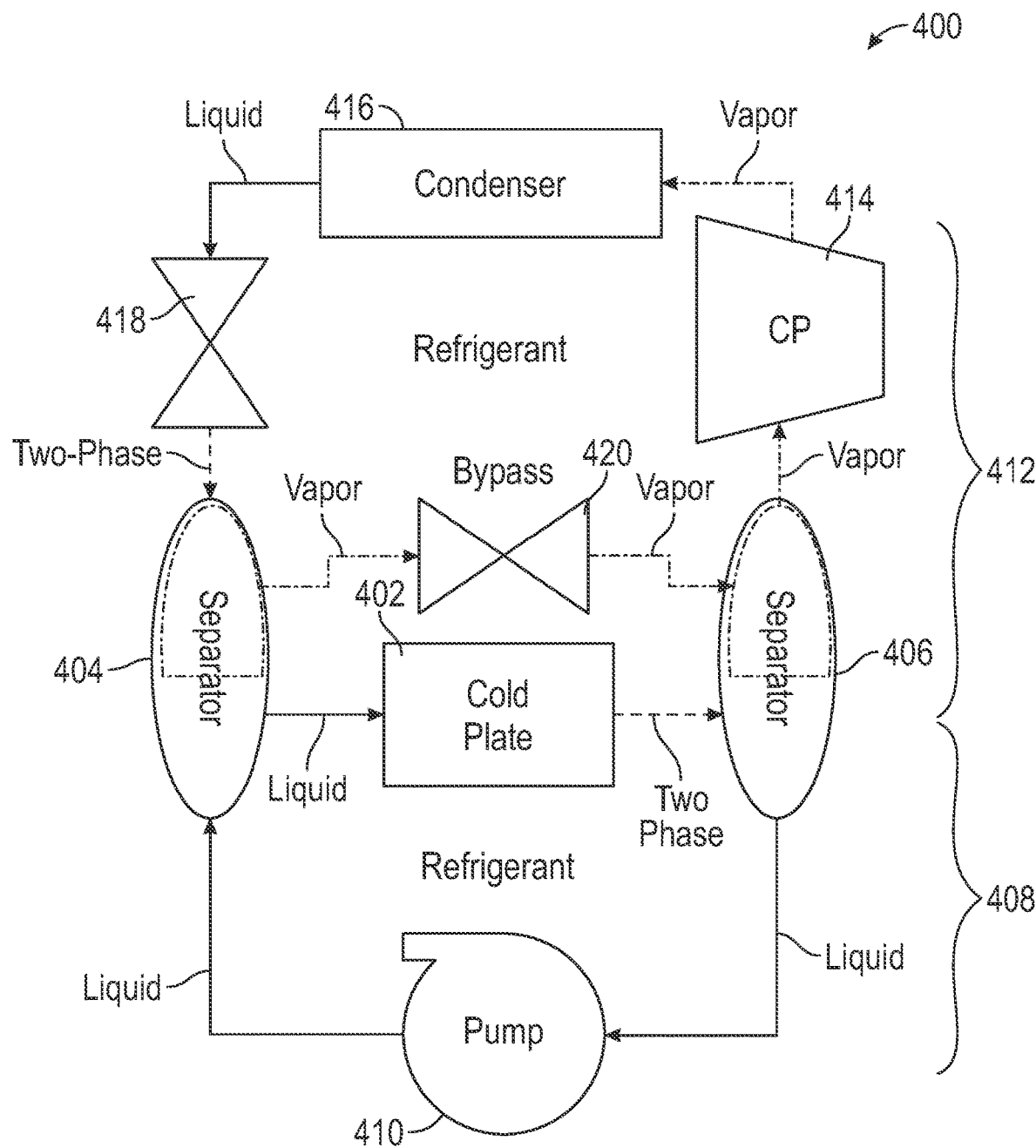
FIG. 4 is a schematic illustration of a single fluid cooling system in accordance with an embodiment of the present disclosure.

Referring now to system 400 of FIG. 4, a two-phase mixture can be separated into liquid and vapor components upstream from the cold plate 402. Similar to the embodiments of FIGS. 2-3, the system 400 is a single-fluid system, using a refrigerant that is in a closed, two-loop system (e.g., vapor and liquid loops). In the system 400 shown in FIG. 4, the liquid provided to cold plate 402 is sourced from an upstream separator 404 and then divided/separated into vapor liquid at a downstream separator 406. As shown, in a liquid loop 408, the downstream separator 406 receives the refrigerant as a two-phase fluid after exiting the cold plate 402. This two-phase fluid is mixed with vapor in the downstream separator 406, and the liquid portion is extracted and pumped in pressure at a pump 410 which is in turn directed into the upstream separator 404 and mixed with a two-phase fluid received from a vapor loop 412. As shown, the vapor loop 412 starts (for example) at the downstream separator 406 where a vapor portion of the fluid within the downstream separator 406 is directed into a compressor 414. The compressed vapor is then condensed into liquid form within a condenser 416. The liquid is then expanded within a valve 418 and converted into a two-phase fluid before being introduced into the upstream separator 404. In this configuration, the vapor from the upstream separator 404 is bypassed around the cold plate 402 and returned directly to the downstream separator 406 and compressor 414 via a bypass valve 420, as shown in FIG. 4. While such a cycle avoids providing vapor into sensitive heat loads (i.e., the cold plate 402), such a system 400 requires careful monitoring and control of the bypass valve 420 to ensure that no vapor enters the cold plate 402. In this configuration, while there is a minimal penalty to efficiency by avoiding vapor within the cold plate 402, there is an increase in weight from the additional components (e.g., upstream separator 404 and/or bypass valve 420).

Figure 5:
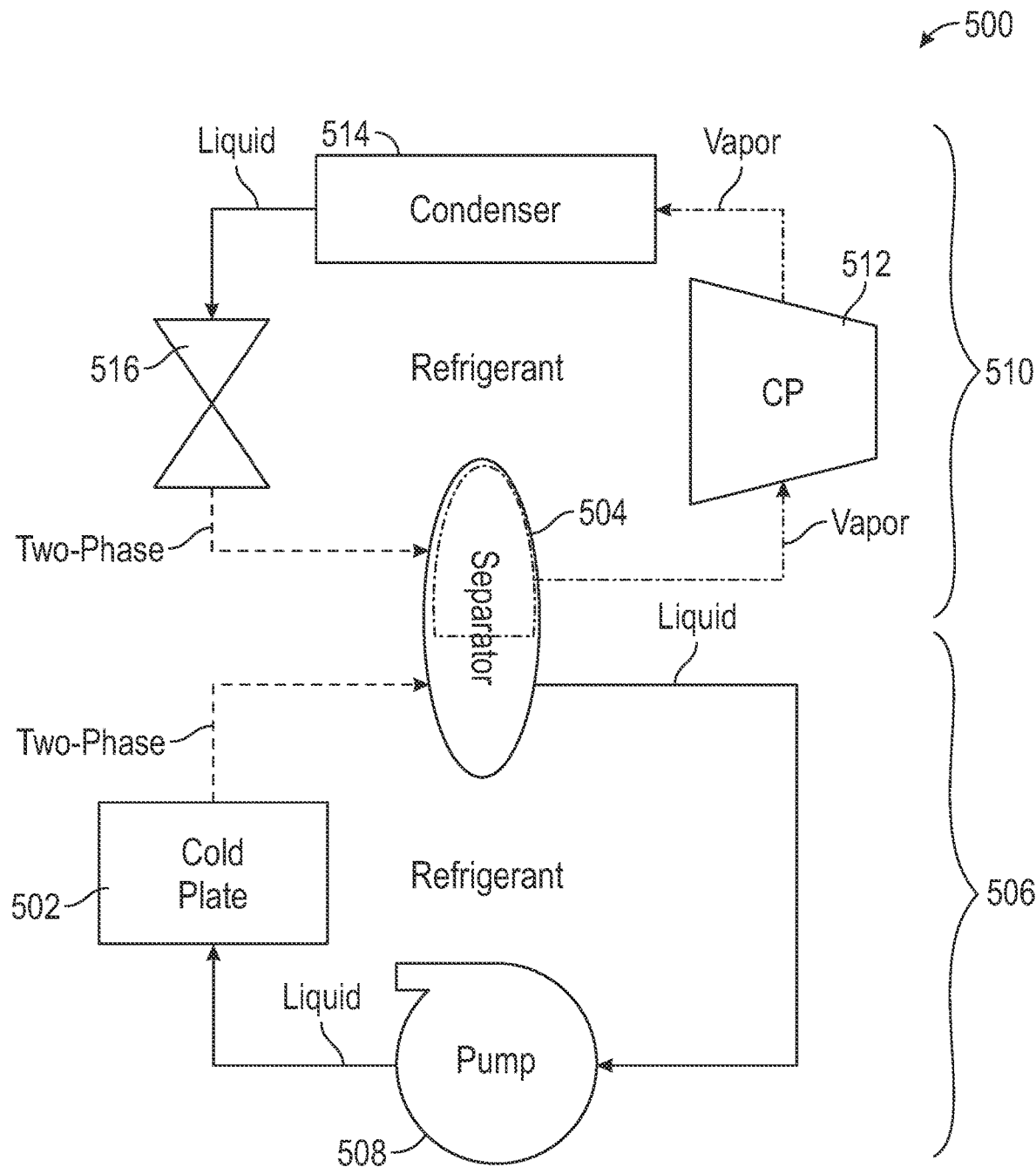
FIG. 5 is a schematic illustration of a single fluid cooling system in accordance with an embodiment of the present disclosure.

Referring now to FIG. 5, a schematic illustration of a single-fluid, two-phase cooling system 500 is shown. The system 500 includes a cold sink (e.g., cold plate 502) that may be thermally coupled to a heat load (not shown) to provide cooling thereto. In this configuration, because a single fluid (e.g., a refrigerant) is used in the cycle of the system 500, a two-phase fluid exits the cold plate 502 where heat was picked up from the coupled heat load. The refrigerant within the system 500 may be, for example and without limitation, 1,1,1,2-Tetrafluoroethane (R-134a) or 2,3,3,3-Tetrafluoropropene (R-1234yf), although other refrigerants may be used without departing from the scope of the present disclosure. The two-phase fluid will be separated into liquid and vapor components within a separator 504. In a liquid loop 506 of the system 500, the liquid portion of the refrigerant sourced from the separator 504 is increased in pressure through a pump 508, similar to the configurations shown and described above, and provided into the cold plate 502 for cooling purposes.

In this embodiment, the vapor portion within the separator 504 is directed into a vapor loop 510. In the vapor loop 510, the refrigerant will be compressed within a compressor 512 and then condensed to a liquid state within a condenser 514. The liquid is then expanded into a two-phase state at a valve 516 (e.g., expansion valve, controllable valve, etc.). The two-phase fluid, from each of the liquid loop 506 and the vapor loop 510, are joined at the separator 504. The separator 504 may operate as a flash tank where the two-phases exiting the valve 516 and the cold plate 502 are separated into liquid and vapor phases by gravity or other mechanism. The system 500 provides a relatively simple complexity system that minimizes the number of components while providing for efficient cooling at a cold sink. The system 500 uses a single fluid (e.g., refrigerant, and no need for a separate coolant) and a single separator that divides the flows of fluids of the refrigerant (e.g., vapor versus liquid).

Figure 6:
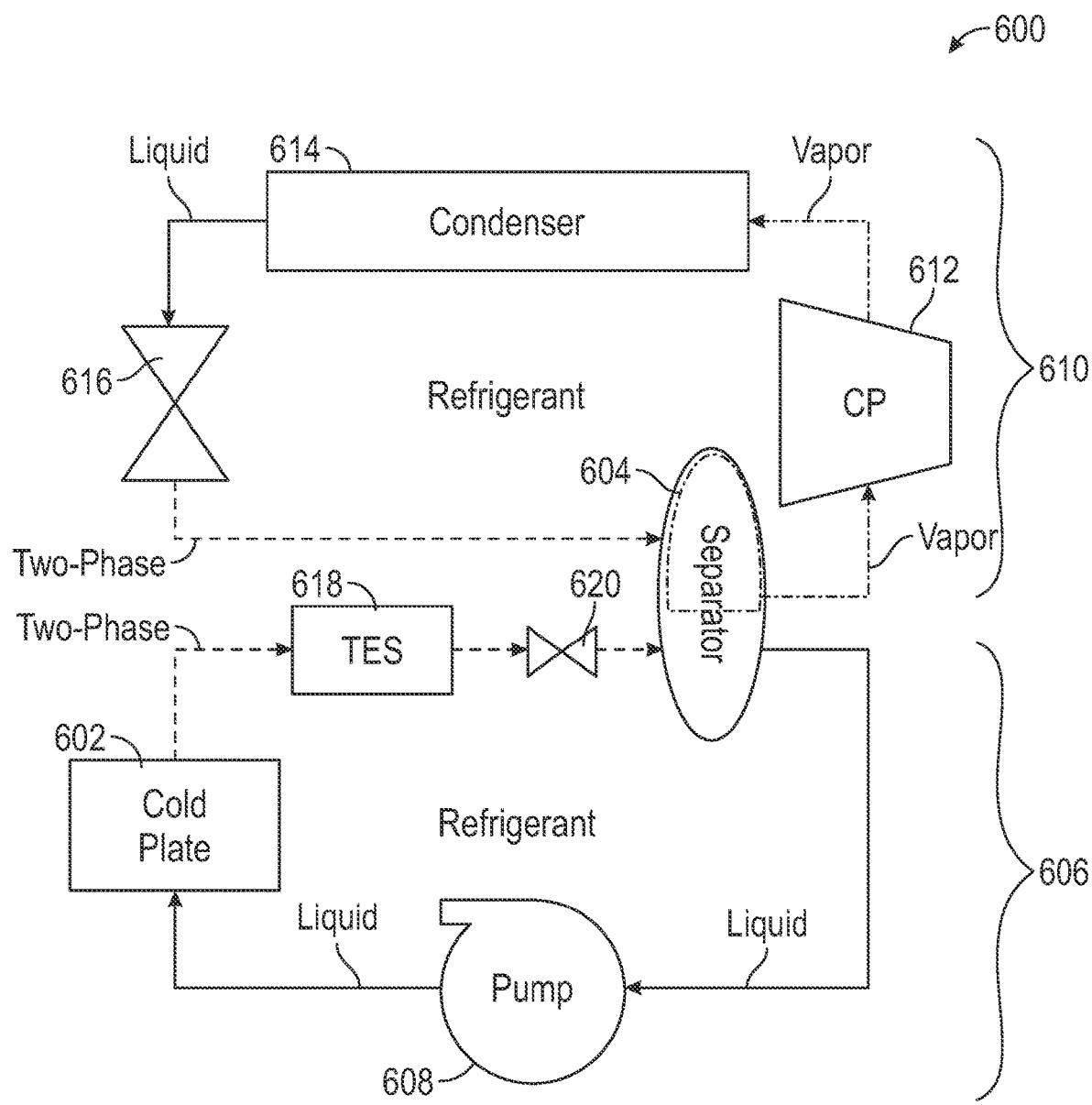
FIG. 6 is a schematic illustration of a single fluid cooling system in accordance with an embodiment of the present disclosure.

Referring now to FIG. 6, a schematic illustration of a single-fluid, two-phase cooling system 600 is shown. The system 600 is similar to that shown and described with respect to FIG. 5, and includes a cold sink (e.g., cold plate 602) that may be thermally coupled to a heat load (not shown) to provide cooling thereto. In this configuration, because a single fluid (e.g., a refrigerant) is used in the cycle of the system 600, a two-phase fluid exits the cold plate 602 where heat was picked up from the coupled heat load. The two-phase fluid will be separated into liquid and vapor components within a separator 604. In a liquid loop 606 of the system 600, the liquid portion of the refrigerant sourced from the separator 604 is increased in pressure through a pump 608 and provided into the cold plate 602 for cooling purposes. The vapor portion within the separator 604 is directed into a vapor loop 610, which includes a compressor 612 and a condenser 614. The liquid is then expanded into a two-phase state at a valve 616. The two-phase fluid, from each of the liquid loop 606 and the vapor loop 610, are joined at the separator 604.

In this embodiment, a thermal energy storage device 618 is arranged in the liquid loop 606 between the cold plate 602 and the separator 604. The thermal energy storage device 618 may be configured as a heat exchanger (e.g., plate-fin or microchannel heat exchanger). In operation, refrigerant enters a manifold, flows through multiple parallel channels, and exits through an outlet manifold. The other side of the heat exchanger may have channels filled with a phase change material (e.g., paraffin) for performing the thermal energy storage. Although a specific thermal energy storage device is described, those of skill in the art will appreciate that embodiments of the present disclosure may incorporate other types of thermal energy storage devices without departing from the scope of the present disclosure. A valve 620 may be arranged between the thermal energy storage device 618 and the separator 604 to ensure that fluid flow from the thermal energy storage device 618 is at necessary pressures.

It will be appreciated that the heat loads may be cyclic and vary significantly over the duration of the cycle. Rather than design the entire system to handle the maximum load (e.g., system 500), significant weight and cost savings can be achieved if the thermal energy storage device 618 is used to reduce the peak loads such that a smaller overall cooling system can be used. The thermal energy storage device 618 may be arranged after the cold plate 602 in order to condense the excess vapor that is generated when the heat loads at the cold plate 602 are at a maximum. It is noted that placing the cold plate in any other location may cause the excess vapor generated during peak heat loads to linger, which would raise the system pressure and destabilize the two-phase loop. Placing the thermal energy storage device 618 immediately after (downstream) the cold plate 602 allows the excess vapor to be condensed, thereby maintaining a constant amount of vapor generation that the compressor 612 can condense on the vapor loop 610, allowing the system pressure to remain constant.

In each of the embodiments of FIGS. 2-6, the separators may be gravity driven components where the denser liquid phase will be separated from a less dense gaseous vapor phase. The compressors arranged downstream in each embodiment is used to pull the vapor phase out of the separator while gravity acts to pull the liquid portion away from the vapor portion. The pumps of the various embodiments may be used to aid in pulling the liquid through the respective liquid loops. It will be appreciated that the separators are not to be limited only to gravity-type separators. For example, centrifugal gas-liquid separators (e.g., single-stage or multi-stage separators) may be used without departing from the scope of the present disclosure.

Figure 7A:
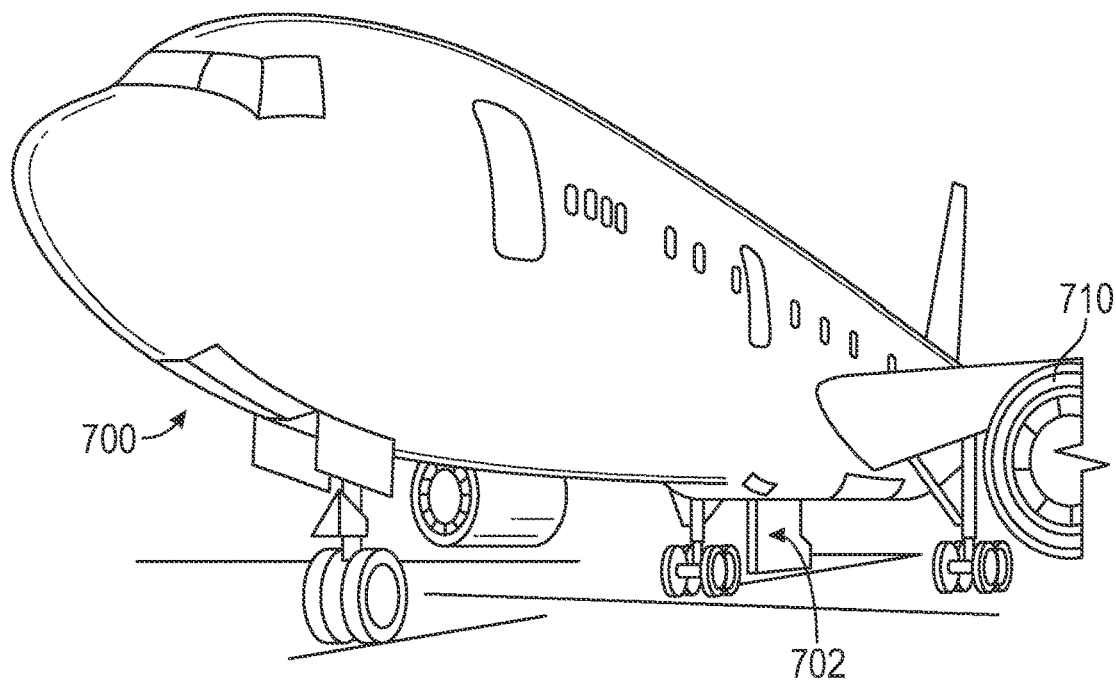
FIG. 7A is a schematic illustration of an aircraft that can incorporate various embodiments of the present disclosure.
Figure 7B:
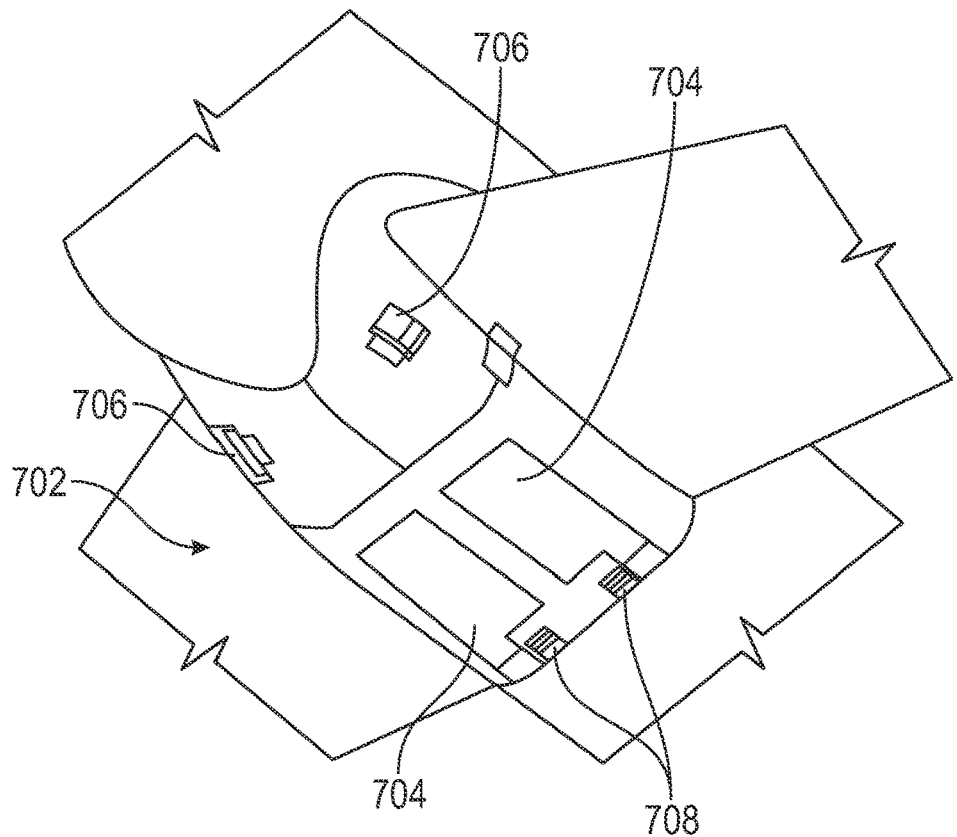
FIG. 7B is a schematic illustration of a bay section of the aircraft of FIG. 7A.

FIGS. 7A-7B are schematic illustrations of an aircraft 700 that can employ one or more embodiments of the present disclosure. As shown in FIGS. 7A-7B, the aircraft 700 includes bays 702 beneath a center wing box. The bays 702 can contain and/or support one or more components of the aircraft 700. For example, in some configurations, the aircraft 700 can include environmental control systems, electronics systems, and/or fuel tank inerting systems within the bays 702. As shown in FIG. 7B, the bays 702 includes bay doors 704 that enable installation and access to one or more components (e.g., environmental control systems, electronics systems, fuel tank inerting systems, etc.). During operation of the onboard systems and components of the aircraft 700, air that is external to the aircraft 700 can be provided to such systems within the bay doors 704 through one or more ram air inlets 706. The air may then flow through the systems to be processed and supplied to various components or locations within the aircraft 700 (e.g., flight deck, passenger cabin, etc.). Some air may be exhausted through one or more ram air exhaust outlets 708. The condensers described above, and part of the cooling systems, may be arranged in fluid or thermal interaction with the ram air or may be arranged within ram air ducts of the aircraft, for aircraft applications of the cooling systems described herein.

Also shown in FIG. 7A, the aircraft 700 includes one or more engines 710. The engines 710 are typically mounted on wings of the aircraft 700, but may be located at other locations depending on the specific aircraft configuration. In some aircraft configurations, air can be bled from the engines 710 and supplied to the onboard systems, as will be appreciated by those of skill in the art.

It will be appreciated that the cooling systems or portions thereof, such as those shown and described above, may be installed onboard an aircraft, such as aircraft 600 shown in FIG. 6. The cooling systems may be configured to cool onboard heat loads. These onboard employments may be thermally coupled to or include a cold sink or cold plate which functions as shown and described above. As such, a portion of the fluid of the cooling systems described above may be passed through or used to cool such heat loads. In some embodiments, the cooling required at the condensers of the systems to generate the liquid state of the fluid in the vapor loops may be provided by a condenser arranged in a ram air duct or configured to receive such air (or treated air). Although shown to be implemented onboard an aircraft, it will be appreciated that embodiments of the present disclosure may be employed in systems such as motor cooling in electric vehicles, server rack cooling in data centers, or the like.

Advantageously, embodiments described herein provide for improved efficiency cooling systems and cycles. For example, fewer structural components may be required in the systems shown and described herein, thus resulting in lower complexity systems and lower weight. Additionally, embodiments of the present disclosure provide for single-fluid, multi-phase cooling systems that efficiently separate liquid and vapor loops to reduce inefficiencies introduced by having a multi-phase fluid in such cooling cycles.

The use of the terms "a", "an", "the", and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. As used herein, the terms "about" and "substantially" are intended to include the degree of error associated with measurement of the particular quantity based upon the equipment available at the time of filing the application. For example, the terms may include a range of ±8%, or 5%, or 2% of a given value or other percentage change as will be appreciated by those of skill in the art for the particular measurement and/or dimensions referred to herein.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description but is only limited by the scope of the appended claims.

What is claimed is:

1. A cooling system comprising:
   a cold sink thermally coupled to a heat load;
   a separator configured to separate liquid and vapor portions of a working fluid; and
   a cooling cycle having a vapor loop and a liquid loop, the cooling cycle having the working fluid configured to pass through both the vapor loop and the liquid loop,
   wherein the vapor loop comprises the separator, a compressor, a condenser, and a valve, wherein a vapor form of the working fluid flows from the separator into the compressor, and the working fluid then flows to the condenser, and then through the valve, and returned to the separator; and
   wherein the liquid loop comprises the cold sink, the separator, and a pump, wherein a liquid form of the working fluid flows from the separator into the pump and the working fluid is increased in pressure and supplied to the cold sink and then returned to the separator,
   wherein the separator is arranged downstream from the cold sink as a downstream separator; and
   an upstream separator is arranged upstream from the cold sink and configured to separate liquid and vapor portions of the working fluid, wherein a liquid portion of the working fluid is sourced from the upstream separator and directed into the cold sink.

2. The cooling system of claim 1, wherein the working fluid is 1,1,1,2-Tetrafluoroethane (R-134a) or 2,3,3,3-Tetrafluoropropene (R-1234yf).

3. The cooling system of claim 1, wherein the heat load is a power electronics component of an aircraft.

4. The cooling system of claim 1, wherein the vapor portion and the liquid portion of the working fluid are separated by gravity in the separator.

5. The cooling system of claim 1, wherein the condenser is fluidically coupled to a ram air duct of an aircraft.

6. The cooling system of claim 1, further comprising a bypass to direct the vapor portion of the working fluid from the upstream separator to the downstream separator and bypassing the cold sink.

7. The cooling system of claim 6, further comprising a valve arranged along the bypass.

8. The cooling system of claim 1, further comprising a heat exchanger configured to receive a portion of the working fluid from the vapor loop output from the condenser as a first fluid and a mixture of fluid from the vapor loop and the liquid loop as a second fluid, wherein the second fluid is cooled to a liquid state as it exits the heat exchanger and enters the cold sink.

9. The cooling system of claim 8, further comprising a second valve between the condenser and the heat exchanger to change the first fluid from a liquid to a two-phase fluid prior to entering the heat exchanger.

10. The cooling system of claim 8, wherein the first fluid is changed to a vapor state as it exits the heat exchanger, and wherein the first fluid in vapor form is directed to the separator.

11. The cooling system of claim 8, further comprising an additional valve arranged between the cold sink and the separator.

12. The cooling system of claim 1, further comprising a thermal energy storage device arranged along the liquid loop between the cold sink and the separator.

13. The cooling system of claim 12, further comprising an additional valve arranged between the thermal energy storage device and the separator.

14. An aircraft cooling system comprising:
    a heat load; and
    a cooling system comprising:
       a cold sink thermally coupled to the heat load;
       a separator configured to separate liquid and vapor portions of a working fluid; and
       a cooling cycle having a vapor loop and a liquid loop, the cooling cycle having the working fluid configured to pass through both the vapor loop and the liquid loop, wherein the vapor loop comprises the separator, a compressor, a condenser, and a valve, wherein a vapor form of the working fluid flows from the separator into the compressor, and the working fluid then flows to the condenser, and then through the valve, and returned to the separator; and
       wherein the liquid loop comprises the cold sink, the separator, and a pump, wherein a liquid form of the working fluid flows from the separator into the pump and the working fluid is increased in pressure and supplied to the cold sink and then returned to the separator,
    further comprising at least one of:
       a thermal energy storage device arranged along the liquid loop between the cold sink and the separator; and
       an upstream separator arranged upstream from the cold sink and configured to separate liquid and vapor portions of the working fluid, wherein a liquid portion of the working fluid is sourced from the upstream separator and directed into the cold sink.

15. The aircraft cooling system of claim 14, wherein the heat load comprises at least one power electronics component of an aircraft.

16. The aircraft cooling system of claim 14, further comprising a heat exchanger configured to receive a portion of the working fluid from the vapor loop output from the condenser as a first fluid and a mixture of fluid from the vapor loop and the liquid loop as a second fluid, wherein the second fluid is cooled to a liquid state as it exits the heat exchanger and enters the cold sink.

17. The aircraft cooling system of claim 14, wherein the condenser is fluidically coupled to a ram air duct of an aircraft.

18. The aircraft cooling system of claim 14, further comprising a bypass to direct the vapor portion of the working fluid from the upstream separator to the downstream separator and bypassing the cold sink.

19. A cooling system comprising:
    a cold sink thermally coupled to a heat load;
    a separator configured to separate liquid and vapor portions of a working fluid; and
    a cooling cycle having a vapor loop and a liquid loop, the cooling cycle having the working fluid configured to pass through both the vapor loop and the liquid loop, wherein the vapor loop comprises the separator, a compressor, a condenser, and a valve, wherein a vapor form of the working fluid flows from the separator into the compressor, and the working fluid then flows to the condenser, and then through the valve, and returned to the separator; and wherein the liquid loop comprises the cold sink, the separator, a thermal energy storage device, and a pump, wherein a liquid form of the working fluid flows from the separator into the pump and the working fluid is increased in pressure and supplied to the thermal energy storage device, to cold sink, and then returned to the separator.

20. The cooling system of claim 19, further comprising an additional valve arranged between the thermal energy storage device and the separator.

* * * * *